(12) United States Patent
Cox et al.

(10) Patent No.: US 9,839,140 B2
(45) Date of Patent: Dec. 5, 2017

(54) METHOD FOR MANUFACTURING AN ELECTRONIC COMPONENT CARRIER FOR MOUNTING THE ELECTRONIC COMPONENT TO A CIRCUIT BOARD

(71) Applicant: Lenovo Enterprise Solutions (Singapore) Pte. Ltd., Singapore (SG)

(72) Inventors: Aaron R. Cox, Tucson, AZ (US); Zhen De Fu, Shanghai (CN); Lei R. Li, Shanghai (CN); Joni E. Saylor, Tucson, AZ (US)

(73) Assignee: LENOVO ENTERPRISE SOLUTIONS (SINGAPORE) PTE. LTD., Singapore (SG)

( * ) Notice: Subject to any disclaimer, the term of this patent is extended or adjusted under 35 U.S.C. 154(b) by 232 days.

(21) Appl. No.: 14/710,542

(22) Filed: May 12, 2015

(65) Prior Publication Data
US 2015/0245498 A1   Aug. 27, 2015

Related U.S. Application Data

(62) Division of application No. 13/771,452, filed on Feb. 20, 2013, now Pat. No. 9,060,453.

(51) Int. Cl.
*H05K 3/30* (2006.01)
*H01R 13/629* (2006.01)
(Continued)

(52) U.S. Cl.
CPC ............. *H05K 3/301* (2013.01); *G06F 1/183* (2013.01); *H01R 13/62955* (2013.01);
(Continued)

(58) Field of Classification Search
CPC ........ H05K 3/0008; H05K 3/30; H05K 3/301; H05K 7/1409; H01R 13/62955;
(Continued)

(56) References Cited

U.S. PATENT DOCUMENTS

| | | |
|---|---|---|
| 3,784,954 A | 1/1974 | Grimm et al. |
| 4,313,150 A | 1/1982 | Chu |
| | (Continued) | |

FOREIGN PATENT DOCUMENTS

| | | |
|---|---|---|
| CN | 1051254 A | 5/1991 |
| CN | 2422670 Y | 3/2001 |
| | (Continued) | |

OTHER PUBLICATIONS

Restriction Requirement from U.S. Appl. No. 13/771,452, dated Sep. 16, 2014.
(Continued)

*Primary Examiner* — Paul D Kim
(74) *Attorney, Agent, or Firm* — Zilka-Kotab, P.C.

(57) ABSTRACT

A method is disclosed for manufacturing an electronic component carrier. The method comprises positioning a header of a frame between opposing attachment arms extending outwardly for attaching an electronic component for seating within the frame. Further, latching members of a latching mechanism of the frame are positioned at a distal end of each of the attachment arms for releaseably seating the electronic component. The attachment arms are resiliently flexible such that the latching members bend to a release position and resiliently return to a grasping position for releasing and grasping the electronic component. Handling levers are positioned for removably mating the electronic component to a connector on a circuit board. The handling levers extend upwardly through an outer casing housing the circuit board when in an open position, and the handling levers are substantially parallel with a top surface of the header when in a closed position.

15 Claims, 9 Drawing Sheets

(51) Int. Cl.
  *H05K 7/14* (2006.01)
  *G06F 1/18* (2006.01)
  *H05K 3/00* (2006.01)

(52) U.S. Cl.
  CPC ............. *H05K 3/0008* (2013.01); *H05K 3/30* (2013.01); *H05K 7/1409* (2013.01); *Y10T 29/4913* (2015.01); *Y10T 29/49133* (2015.01); *Y10T 29/49826* (2015.01)

(58) Field of Classification Search
  CPC ............... G06F 1/183; Y10T 29/49133; Y10T 29/4913; Y10T 29/49826
  See application file for complete search history.

(56) References Cited

U.S. PATENT DOCUMENTS

| | | | |
|---|---|---|---|
| 4,372,635 A | 2/1983 | Waldschmidt | |
| 4,511,199 A | 4/1985 | Erlam et al. | |
| 4,537,454 A * | 8/1985 | Douty | H01R 13/62994 439/157 |
| 4,614,389 A | 9/1986 | Albert et al. | |
| 4,914,552 A * | 4/1990 | Kecmer | H05K 7/1404 211/41.17 |
| 5,162,979 A | 11/1992 | Anzelone et al. | |
| 5,355,489 A | 10/1994 | Bealkowski et al. | |
| 5,535,100 A | 7/1996 | Lubahn et al. | |
| 5,644,470 A | 7/1997 | Benedict et al. | |
| 5,673,174 A | 9/1997 | Hamirani | |
| 5,786,984 A | 7/1998 | Bonardi et al. | |
| 5,906,497 A * | 5/1999 | Pham | G06F 1/184 361/679.46 |
| 5,946,196 A * | 8/1999 | Baek | H05K 7/1409 361/753 |
| 5,967,824 A | 10/1999 | Neal et al. | |
| 6,045,385 A * | 4/2000 | Kane | G06F 1/183 439/327 |
| 6,056,574 A * | 5/2000 | Yeomans | H01R 13/6273 361/801 |
| 6,056,579 A | 5/2000 | Richards, III et al. | |
| 6,172,880 B1 | 1/2001 | Petitpierre | |
| 6,185,093 B1 | 2/2001 | Moss | |
| 6,208,523 B1 * | 3/2001 | Bertolami | G06F 1/183 211/41.17 |
| 6,884,096 B2 * | 4/2005 | Centola | H01R 13/62933 361/798 |
| 7,002,811 B2 | 2/2006 | Jing et al. | |
| 7,083,444 B1 * | 8/2006 | Barina | G06F 1/185 439/157 |
| 7,408,788 B2 * | 8/2008 | Rubenstein | H05K 7/1409 361/754 |
| 8,559,187 B2 * | 10/2013 | Peng | H05K 7/1431 361/798 |
| 9,060,453 B2 | 6/2015 | Cox et al. | |
| 2014/0235080 A1 | 8/2014 | Cox et al. | |

FOREIGN PATENT DOCUMENTS

| | | |
|---|---|---|
| CN | 201063340 Y | 5/2008 |
| CN | 201607673 U | 10/2010 |
| JP | 2000315871 A | 11/2000 |
| JP | 2005122630 A | 5/2005 |
| JP | 2007281430 A | 10/2007 |

OTHER PUBLICATIONS

Non-Final Office Action from U.S. Appl. No. 13/771,452, dated Oct. 22, 2014.
Notice of Allowance from U.S. Appl. No. 13/771,452, dated Feb. 12, 2015.
Cox et al., U.S. Appl. No. 13/771,452, filed Feb. 20, 2013.
International Search Report and Written Opinion, International Application No. PCT/IB2014/058828, dated Jun. 13, 2014.
International Preliminary Report from International Application No. PCT/IB2014/058828, dated Aug. 25, 2015.

* cited by examiner

METHOD FOR MANUFACTURING AN ELECTRONIC COMPONENT CARRIER FOR MOUNTING THE ELECTRONIC COMPONENT TO A CIRCUIT BOARD

FIELD

The present disclosure relates to a device and method for inserting and removing an electronic component in a computer; and more particularly, relates to a device and method for inserting and removing a memory card on a circuit board in a computer.

BACKGROUND

Typical Information Technology (IT) computer systems, such as server equipment, may include components which are difficult to service, or replace (swap out). Computer system may include "tower" servers, and enterprise rack-mount systems. For example, server operations may include memory cards such as Dual In-line Memory Modules (DIMM) for memory capacity, which can be added and upgraded to improve system performance. Many DIMMS may be directly mounted to a server or storage device's circuit board. Because of their low profile compared to other system components, DIMMs are likely to be covered by the computer system's housing, which requires a repair technician to remove the housing or cover to service DIMM hardware. This operation is typically performed by a trained person or advanced user who is trained to work with the system's delicate internal components.

One disadvantage of the current state of the art for replacing components on a circuit board, such as the memory card (DIMM) discussed above, is that employing trained service technicians is costly, especially in the small business environment. Another disadvantage is that, varying by country, it may not be lawful under warranty contracts for uncertified service personnel to service computer equipment that is located underneath the system's housing, thus only a certified technician may have to perform a component upgrade, in the above example, replace a DIMM. Another disadvantage of present techniques of replacing components is that the internal components of a computer system, e.g., a server, are sensitive to physical and electrical disturbance and may be damaged. For example, static discharge can cause damage to components within the server when handling a memory card in the computer case.

In one example of the current art, a DIMM may be directly mounted to the circuit board. A pair of pivoting latches close around the DIMM when it is inserted into a mating connector/slot on the circuit board. These small latches are pushed outward for DIMM removal, which can be awkward in the confined space available.

Figure 1:
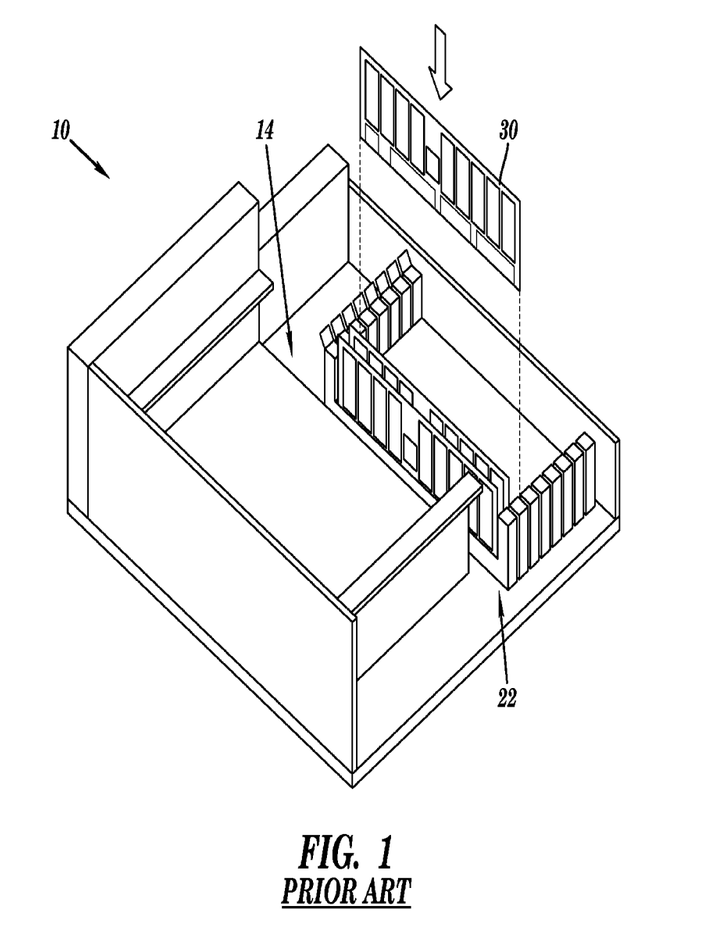
FIG. 1 is an isometric view of a prior art circuit board of a computer having a DIMM inserted into a receiving slot of a connector on the circuit board.
Figure 2:
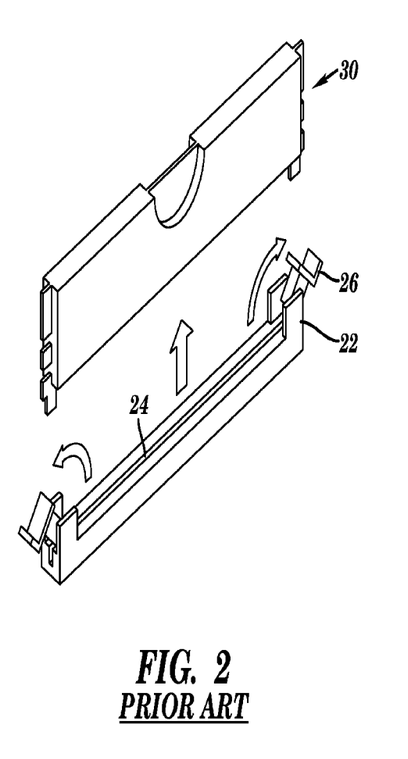
FIG. 2 is a detailed isometric view of the DIMM being removed from the slot in the connector as shown in FIG. 1, according to the prior art.

Referring to FIGS. 1 and 2, a prior art system 10 for installing a DIMM includes a DIMM filler/blank 30 being inserted into a slot 24 on a circuit board 14. The slot 24 is in a connector 22 mounted on the circuit board 14. The DIMM filler/blank 30 is inserted into the slot 24 as shown by the arrow in FIG. 1. The latches 26 snap over mating portions of the DIMM filler/blank 30 to secure the DIMM. The latches 26 are difficult to reach inside the computer casing. The latch 26 must be opened to remove the DIMM filler/blank as shown in FIG. 2. One disadvantage of the latches is that they occupy valuable space on the circuit board 14, in addition to being difficult to reach by a technician.

It would therefore be desirable to provide a device and method for servicing a computer component, such as a DIMM, which is difficult to service because of its positioning in the computer, for example, being covered by a housing as described above relating to a DIMM. A desired device may allow a service method or procedure for a component, for example DIMMs, to be accessed from a system's exterior. It would also be desirable to provide a device, system, and method for connecting and removing, and/or replacing a computer component in a slot/connector connected to a circuit board without having to use a trained technician.

BRIEF SUMMARY

In an aspect of the invention, an apparatus for holding an electronic component for mounting on a circuit board includes a frame including a header having opposing attachment arms extending therefrom for seating an electronic component within the frame. A latching mechanism of the frame includes latching members at a distal end of each of the attachment arms for releaseably seating the electronic component between the attachment members. Handling levers are for removably mating the electronic component to a connector on a circuit board. The handling levers extend upwardly from the header through an outer casing housing the circuit board.

In another aspect of the invention, an electronic component carrier for mounting the electronic component to a circuit board includes a frame including a header having opposing attachment arms extending outwardly therefrom for seating an electronic component within the frame. A latching mechanism of the frame includes latching members at a distal end of each of the attachment arms for releaseably seating the electronic component between the attachment members. The attachment members are resiliently flexible such that the latching members bend to a release position and resiliently return to a grasping position for releasing and grasping the electronic component, respectively. Handling levers are for removably mating the electronic component to a connector on a circuit board. The handling levers extend upwardly from the header through an outer casing housing the circuit board when in an open position for manually removing the electronic component from the connector. The handling levers are substantially parallel with a top surface of the header when in a closed position when the electronic component is mated to the connector.

In another aspect of the invention, an electronic component holding system for mounting the electronic component to a circuit board includes a frame including a header having opposing attachment arms extending outwardly therefrom for seating an electronic component within the frame. A latching mechanism of the frame includes latching members at a distal end of each of the attachment arms for releaseably seating the electronic component between the attachment members. The attachment members are resiliently flexible such that the latching members bend to a release position and resiliently return to a grasping position for releasing and grasping the electronic component, respectively. Handling levers are for removably mating the electronic component to a connector on a circuit board. The handling levers extend upwardly from the header through an outer casing housing the circuit board when in an open position for manually removing the electronic component from the connector. The handling levers are substantially parallel with a top surface of the header when in a closed position when the electronic component is mated to the connector. A housing configured to receive the frame within the housing and operatively engage extension elements extending from the distal ends of each of the handling levers and passing through a mating pair of openings defined by the header and the housing for each of the extension elements. The extension elements extending angularly through their respective openings when the handling levers are in the open position such that the apparatus can be removed from the outer casing. The extension elements abutting a top of each of the openings when the handling levers are in the closed position such that the apparatus is locked in the housing and the electronic component is seated in the connector.

In another aspect of the invention, a method for manufacturing an electronic component carrier for mounting the electronic component to a circuit board includes: positioning a header of a frame between opposing attachment arms extending outwardly for attaching an electronic component for seating within the frame; positioning latching members of a latching mechanism of the frame at a distal end of each of the attachment arms for releaseably seating the electronic component between the attachment members, the attachment members being resiliently flexible such that the latching members bend to a release position and resiliently return to a grasping position for releasing and grasping the electronic component, respectively; and handling levers for removably mating the electronic component to a connector on a circuit board, the handling levers extend upwardly through an outer casing housing the circuit board when in an open position for manually removing the electronic component from the connector, and the handling levers being substantially parallel with a top surface of the header when in a closed position when the electronic component is mated to the connector.

In another aspect of the invention, a method for mounting an electronic component to a circuit board includes: releaseably seating an electronic component between opposing attachment members of a frame including a header using a latching mechanism including the attachment members being resiliently flexible; opening handling levers for removably mating the electronic component to a receiving slot on a circuit board, the handling levers extend upwardly from the header through an outer casing housing the circuit board when in an open position for manually removing the electronic component from a receiving slot of the circuit board; and closing the handling levers to being substantially parallel with a top surface of the header when in a closed position when the electronic component is mated to the receiving slot.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIG. 10a is an isometric view of the DIMM carrier shown in FIGS. 6 and 9a;

DETAILED DESCRIPTION

Figure 3:
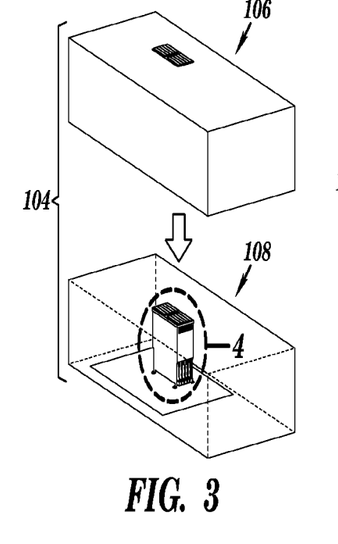
FIG. 3 is an isometric view of a computer system assembly including a housing, circuit board, and carrier assembly according to an embodiment of the invention.
Figures 4, 5:
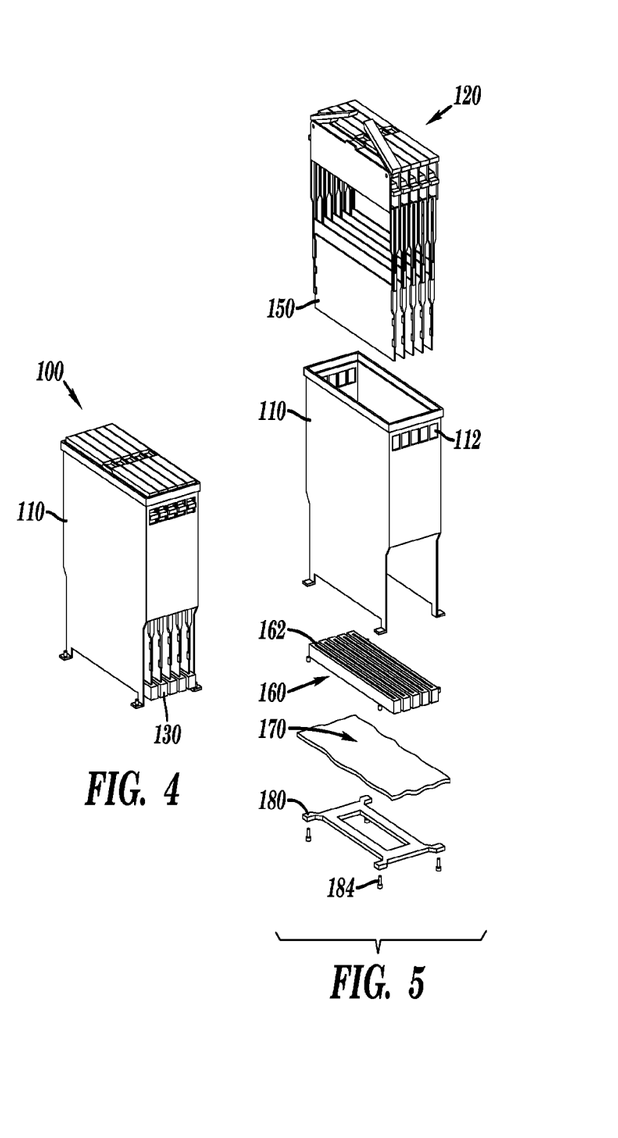
FIG. 4 is a detailed isometric view of the carrier assembly shown in FIG. 3.
FIG. 5 is an isometric assembly view of the carrier assembly shown in FIG. 4 depicting multiple carriers holding DIMMs, a housing positioned over connectors mounted on a circuit board using screws and a frame under the circuit board.

Referring to FIGS. 3-5, a carrier assembly 100 according to an embodiment of the disclosure for carrying an electronic component is positioned in a computer housing 104. The computer housing 104 includes mating top and bottom pieces 106, 108, respectively. The carrier assembly 100 is one embodiment of an apparatus, carrier device, or carrier system, for holding and carrying electronic components which may be used in a method for carrying an electronic component such as a Dual In-Line Memory Module (DIMM). The carrier assembly 100 shown in FIGS. 4 and 5 includes a housing 110, a plurality of carriers 120, and connectors 160. The connectors 160 are attached to a circuit board 170 using a plate 180 positioned beneath the circuit board 170. Screws 184 through the plate 180, circuit board 170, and connectors 160 attached the connectors to the circuit board. For illustrative purposes the electronic component is a DIMM 150 as shown in the FIGS. The plurality of carriers 120 as shown in FIG. 5 are holding DIMMs 150. The connectors 160 include slots 162 for seating the DIMMs. The housing 110 includes openings 112 for accommodating extensions 142.

Figure 6:
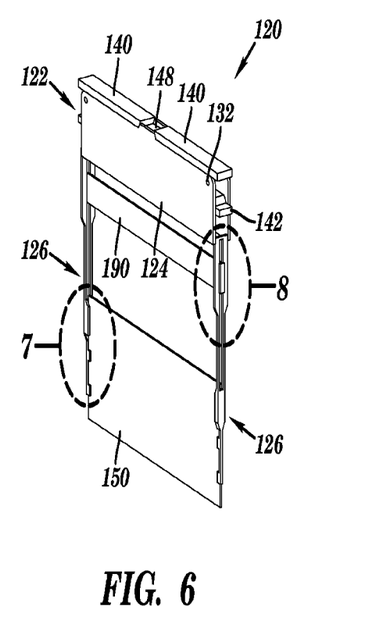
FIG. 6 is an isometric view of the DIMM carrier shown in FIGS. 3-5 holding a DIMM and including a slide member.
Figure 7:
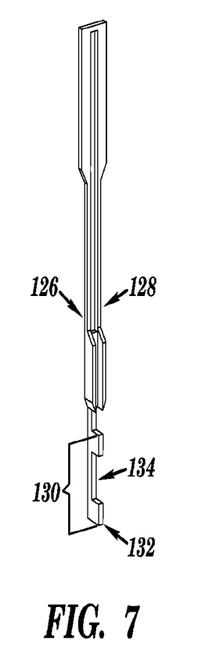
FIG. 7 is a detail isometric view of an arm of the DIMM carrier showing the inside of the arm and attachment members.
Figure 8:
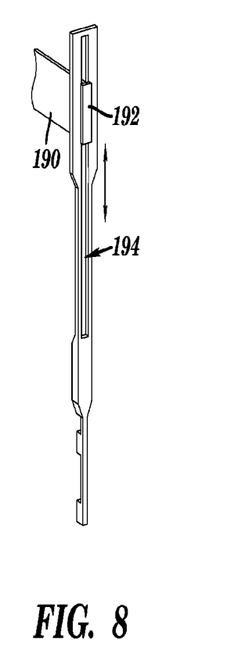
FIG. 8 is a detail isometric view of another arm of the DIMM carrier showing the outside of the arm and the vertical motion of the slide member.

Referring to FIGS. 6-8, the carrier 120 is shown in more detail and described hereinafter. The carrier 120 includes a frame 122 which includes a header 124 and opposing attachment arms 126. Two handling levers 140 are pivotably attached to the header 124 at pivot points 132. A release button 148 is an embodiment of a release mechanism for the handling levers 140 is positioned centrally between the levers 140 which are in a closed position flush with the top of the header 124.

The arms 126 are shown in detail in FIGS. 7 and 8. A distal end of the arms 126 includes an inwardly facing groove 128 and latching members 130 as an embodiment of a latching mechanism. The DIMM 150 is seated in the groove 128. The latching members 130 include hooks 132 defining a groove 134 therebetween for holding the DIMM 150 as an embodiment of locking element, as shown in FIGS. 5 and 6. The arms 126 are resiliently bendable so that the DIMM 150 can be removed and attached between the arms 126, as discussed in more detail below with respect to FIG. 9b.

One embodiment of a moveable locking device 190 is positioned between the arms 126 above the DIMM 150. A end slide 192 fits through a groove 194 so that the locking device can slide in the groove 194. The locking device slides downwardly to mate with the top of the DIMM to lock the DIMM in place between the arms.

Figure 9A:
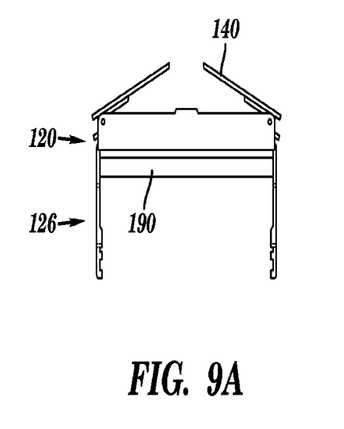
FIG. 9a is a front elevational view of the DIMM carrier shown in FIG. 6 having handling levers in an open position, opposing vertical arms, and a slide member between the arms.
Figure 9B:
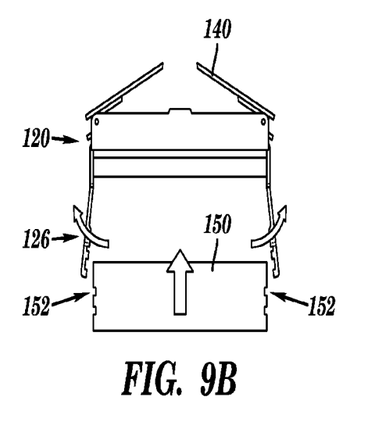
FIG. 9b is a front elevational view of the DIMM carrier shown in FIG. 9a wherein the arms are resiliently bend outwardly for insertion of a DIMM therebetween.
Figure 9C:
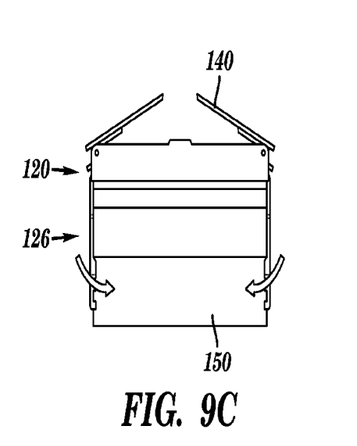
FIG. 9c is a front elevational view of the DIMM carrier shown in FIG. 9b with the DIMM in place between the arms.
Figure 9D:
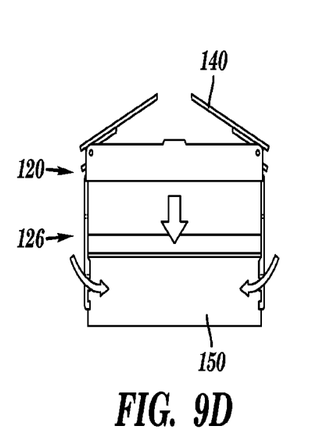
FIG. 9d is a front elevational view of the DIMM carrier shown in FIG. 9c with the slide member being moved down to rest on top of the DIMM.

Referring to FIGS. 9a-9d, the carrier 120 includes the locking device 190 between the arms 126. The handling levers 140 are in an open position. In FIG. 9b, the arms 126 are resiliently bent outwardly to insert the DIMM 150 therebetween. The hooks 132 on the latching members 130 of the arms 126 mate with notches 152 on the DIMM 150. In FIG. 9c, the resilient arms 126 are allowed to return to their initial positions having the DIMM 150 held therebetween. The locking device 190 is slid downwardly to contact the top of the DIMM 150 locking the DIMM in position. The locking device 190 prevents the arms 126 from being bent outwardly, thus preventing the DIMM 150 from being released.

Figure 10A:
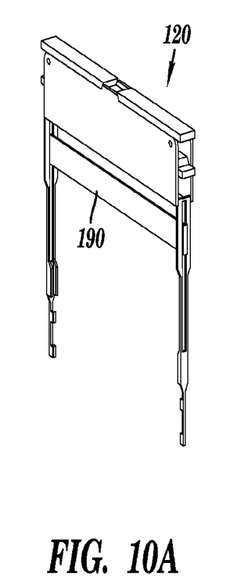
Figure 10B:
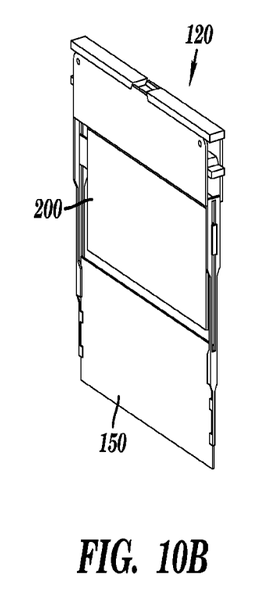
FIG. 10b is an isometric view of the DIMM carrier shown in FIG. 10a including a heat transfer element attached to the slide member.
Figure 10C:
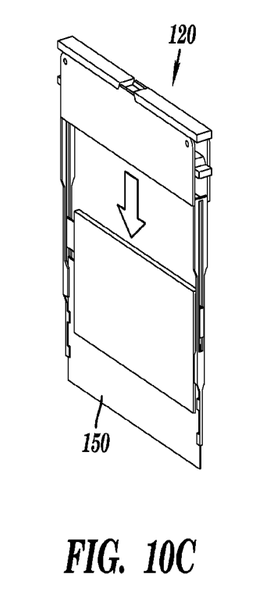
FIG. 10c is an isometric view of the DIMM carrier shown in FIG. 10b having the heat transfer element slid down to overlap a portion of the DIMM.

Referring to FIGS. 10a-10c, the carrier 120 is fitted with a heat transfer device or a heat sink 200 which attaches to the locking device 190. The heat transfer device is optional in the carrier. The heat transfer device 200 is positioned between the arms 126 above the DIMM 150, as shown in FIG. 10b. When the locking device 190 is moved downwardly to lock the DIMM in place, the heat sink 200 pressure fits over the DIMM, partially covering the DIMM as shown in FIG. 10c. The heat transfer device 200 provides heat transfer from the DIMM 150 or other electronic component to maintain a desirable temperature of the DIMM. In an alternative, the heat sink and the locking device may be one integral device providing the combined functions of locking the arms and DIMM, and transferring heat from the DIMM.

Figure 11:
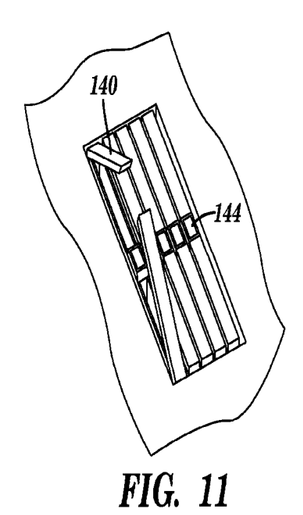
FIG. 11 is an isometric view of the top of the housing shown in FIGS. 4 and 5 for a plurality of carriers showing handling levers in open and closed positions.
Figure 12:
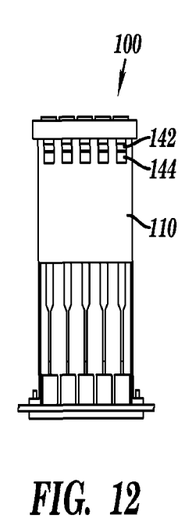
FIG. 12 is a side elevational view of the carrier assembly shown in FIGS. 4 and 5 shown mounted to the circuit board.
Figure 13:
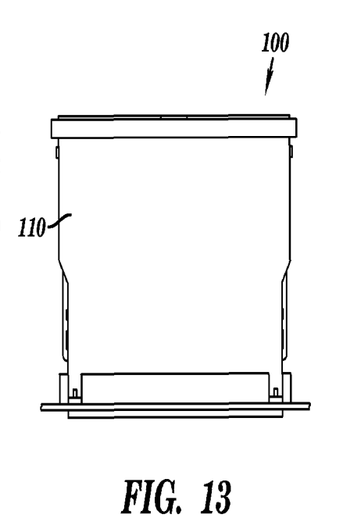
FIG. 13 is a front elevational view of the carrier assembly shown in FIG. 12.

Referring to FIGS. 11-13, the handling levers 140 of a carrier are shown in the open position. Extensions 142 (can be generically referred to as extension elements) extend from the distal ends of the handling levers 140 and extend through openings 144 in both side of the housing 110 which mate with openings in both sides of the header, respectively. When the handling levers 140 are in the open position, the extensions 142 toggle at a downward incline through the openings 144 such that the carrier can be lifted out of the housing. When the handling levers 140 are being closed, the extension 142 toggle upwardly meeting the top of the opening 144 connectively exerting downward pressure on DIMM in the slot via the frame 122, thereby, seating the DIMM in the slot of the connector. Thus, when the handling levers 140 are in the closed position, the extensions 142 extend horizontally through the openings 144 abutting the top of the opening 144, locking the carrier 120 in the housing 110 and seating the DIMM in the slot of the connector. The handling levers thus have a caming effect by the extensions interacting with the header and housing through the openings to lock and release the DIMM from its slot.

Figures 14A, 14B:
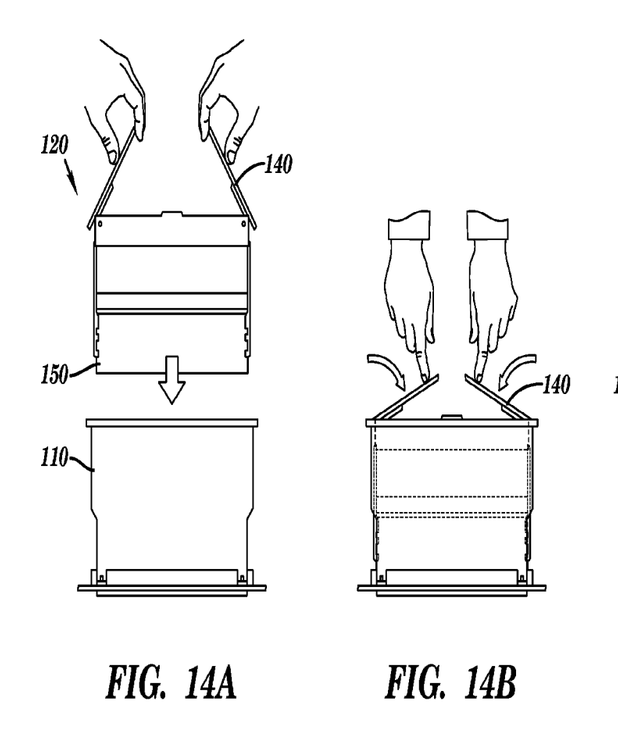
FIG. 14a is a front elevational view of the DIMM carrier with handling levers open being inserted in to the housing of the DIMM carrier.
FIG. 14b is a front elevational view of the DIMM carrier of FIG. 14a inserted into the housing and the handling levers being closed.
Figure 14C:
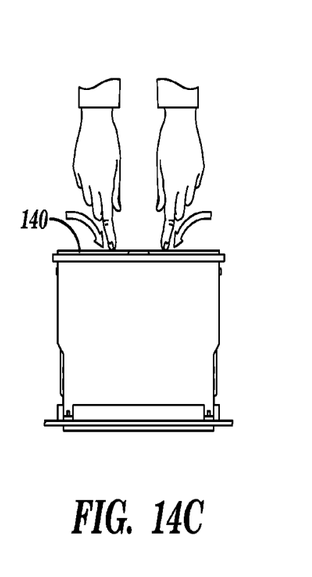
FIG. 14c is a front elevational view of the DIMM carrier of FIG. 14b inserted into the housing and the handling levers in the closed position.

Referring to FIGS. 14a-14c, a sequence is shown regarding a method of mounting the DIMM on the circuit board using the carrier 120. The handling levers 140 are used to lower the DIMM attached to the arms of the carrier 120 into the housing 110 in FIG. 14a. The DIMM is aligned into a slot in the connector. Once the DIMM is seated in the slot of the connector, the handling levers 140 are lowered into their closed position as shown in FIGS. 14b and 14c, which locks the DIMM in position in the slot 162 and also seats the DIMM in the slot.

Figure 15A:
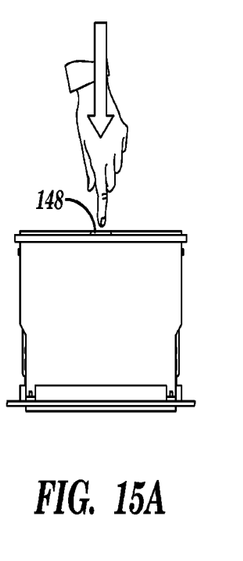
FIG. 15a is a front relational view of the DIMM carrier of FIG. 14c inserted into the housing and the handling levers being released by pressing a release mechanism.
Figure 15B:
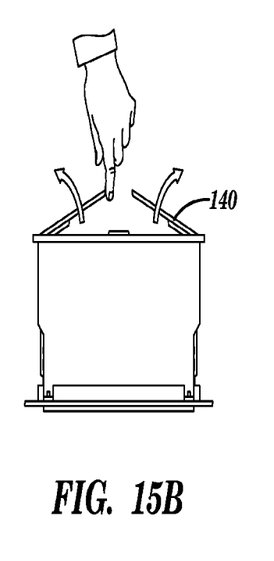
FIG. 15b is a front elevational view of the DIMM carrier of FIG. 15a with the handling levers being opened.
Figure 15C:
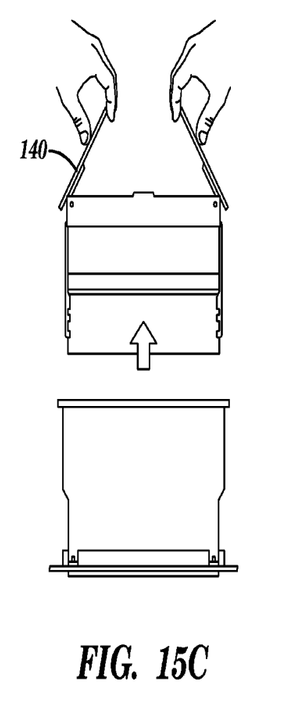
FIG. 15c is a front elevational view of the DIMM carrier of FIG. 15b being removed from the housing using the handling levers.

Referring to FIGS. 15a-15c, a sequence is shown regarding a method of removing the DIMM from the circuit board using the carrier 120. The release button 148 is depressed and the handling levers 140 swing open as shown in FIGS. 15a and 15b. The carrier 120 can then be removed from the housing in concert with the DIMM being removed from the slot of the connector by pulling the handling levers upwardly as shown in FIG. 15c.

Thereby, the carrier assembly 100 according to the disclosure is provided which saves time and costs for servicing computer to replace component such as a DIMM. The carrier does not require a trained technician to remove and insert a card, because the DIMM is accessible through the outside of the outer casing of the computer. Another advantage of the present disclosure is that the carrier assembly decreases the amount of space required on the circuit board or a component, such as the DIMM, and its associated mechanism to lock into the housing. The carrier assembly 100 also minimizes risk of damaging other internal components as the individual carriers only engage the inside of the computer through the housing.

While embodiments of the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

The invention claimed is:

1. A method, comprising:
    positioning a header of a frame between opposing attachment arms for seating an electronic component in the frame;
    positioning latching members of a latching mechanism of the frame at a distal end of each of the attachment arms for releaseably seating the electronic component between the attachment arms, the attachment arms being resiliently flexible such that the latching members bend to a release position and resiliently return to a grasping position for releasing and grasping the electronic component, respectively;
    positioning handling levers for removably mating the electronic component to a connector on a circuit board, the handling levers extending upwardly through an outer casing housing the circuit board when in an open position for manually removing the electronic component from the connector, and the handling levers being substantially parallel with a top surface of the header when in a closed position when the electronic component is mated to the connector; and
    positioning a moveable locking device within grooves of the attachment arms, wherein each of the grooves extend down a length of one of the attachment arms from a proximal end of the attachment arm.

2. A method, comprising:
    positioning a header of a frame between opposing attachment arms extending outwardly for attaching an electronic component for seating within the frame;
    positioning latching members of a latching mechanism of the frame at a distal end of each of the attachment arms for releaseably seating the electronic component between the attachment arms, the attachment arms being resiliently flexible such that the latching members bend to a release position and resiliently return to a grasping position for releasing and grasping the electronic component, respectively;
    positioning handling levers for removably mating the electronic component to a connector on a circuit board, the handling levers extending upwardly through an outer casing housing the circuit board when in an open position for manually removing the electronic component from the connector, and the handling levers being substantially parallel with a top surface of the header when in a closed position when the electronic component is mated to the connector; and
    positioning a release button within the header and centrally between the handling levers.

3. A method for mounting an electronic component to a circuit board, the method comprising:
    releaseably seating an electronic component between opposing resiliently deformable attachment arms of a frame including a header using a latching mechanism;
    opening handling levers for removably mating the electronic component to a receiving slot on a circuit board, the handling levers extending upwardly from the header through an outer casing housing the circuit board when in an open position for manually removing the electronic component from the receiving slot of the circuit board;
    when the electronic component is mated to the receiving slot, closing the handling levers to be positioned substantially parallel with a top surface of the header; and
    positioning a moveable locking device in grooves of the attachment arms, such that the moveable locking device is slideably positioned between the opposing attachment arms.

4. The method of claim 3, further comprising:
    bending resiliently deformable latching members to a release position and allowing the latching members to return to a grasping position for releasing and grasping the electronic component, respectively, the latching members being part of the latching mechanism and being positioned at a distal end of each of the attachment arms.

5. The method of claim 3, wherein releaseably seating the electronic component between the opposing attachment arms of the frame comprises releasably seating the electronic component between the latching members at the distal ends of the opposing attachment arms.

6. The method of claim 5, further comprising sliding the moveable locking device positioned between the opposing attachment arms such that the moveable locking device locks the electronic component between the opposing attachment arms.

7. The method of claim 6, wherein the moveable locking device engages a top of the electronic component for locking the electronic component between the opposing attachment arms.

8. The method of claim 7, wherein the electronic component is a Dual In-line Memory Module (DIMM).

9. The method of claim 7, further comprising lowering the electronic component between the opposing attachment arms of the frame, and aligning the electronic component into the receiving slot of the circuit board.

10. The method of claim 9, further comprising lowering the handling levers into a closed position.

11. The method of claim 3, further comprising attaching a heat transfer device to the moveable locking device.

12. The method of claim 11, wherein releaseably seating the electronic component between the opposing attachment arms of the frame comprises releasably seating the electronic component between the latching members at the distal ends of the opposing attachment arms.

13. The method of claim 12, further comprising sliding the moveable locking device positioned between the opposing attachment arms such that the moveable locking device locks the electronic component between the opposing attachment arms, and the heat transfer device is in thermal communication with the electronic component.

14. The method of claim 13, wherein the heat transfer device at least partially covers the electronic component.

15. The method of claim 14, wherein the electronic component is a Dual In-line Memory Module (DIMM).

* * * * *